United States Patent
Wirbeleit et al.

(10) Patent No.: US 7,326,601 B2
(45) Date of Patent: Feb. 5, 2008

(54) METHODS FOR FABRICATION OF A STRESSED MOS DEVICE

(75) Inventors: Frank Wirbeleit, Wappingers Falls, NY (US); Linda R. Black, Wappingers Falls, NY (US); Igor Peidous, Fishkill, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 254 days.

(21) Appl. No.: 11/235,791

(22) Filed: Sep. 26, 2005

(65) Prior Publication Data

US 2007/0072380 A1   Mar. 29, 2007

(51) Int. Cl.
*H01L 21/84* (2006.01)
(52) U.S. Cl. ............... 438/151; 438/275; 257/E21.561
(58) Field of Classification Search ............... 438/231, 438/301, 303, 305, 151–166, 275; 257/E21.561
See application file for complete search history.

(56) References Cited

U.S. PATENT DOCUMENTS

| | | | |
|---|---|---|---|
| 4,382,827 A * | 5/1983 | Romano-Moran et al. .. | 438/232 |
| 6,165,826 A | 12/2000 | Chau et al. | |
| 6,204,145 B1 | 3/2001 | Noble | |
| 6,989,570 B2 * | 1/2006 | Skotnicki et al. .......... | 257/347 |
| 2002/0086472 A1 | 7/2002 | Roberds et al. | |
| 2004/0108559 A1 | 6/2004 | Sugil et al. | |
| 2004/0217391 A1 | 11/2004 | Forbes | |
| 2005/0064669 A1 | 3/2005 | Orlowski et al. | |

FOREIGN PATENT DOCUMENTS

FR   2838237   10/2003

OTHER PUBLICATIONS

International Search Report for PCT/US2006/032755, mailed Jan. 19, 2007.
Skotnicki, T., "Silicon on Nothing (SON)—Fabrication, Material and Devices," Electromechanical Society Proceedings, vol. 2001, No. 3, Mar. 25, 2001, pp. 391-402.

* cited by examiner

*Primary Examiner*—Richard A. Booth
(74) *Attorney, Agent, or Firm*—Ingrassia Fisher & Lorenz, P.C.

(57) ABSTRACT

Methods for fabricating a stressed MOS device is provided. One method comprises the steps of providing a monocrystalline semiconductor substrate having a surface and a channel abutting the surface. A gate electrode having a first edge and a second edge is formed overlying the monocrystalline semiconductor substrate. The substrate is anisotropically etched to form a first recess aligned with the first edge and a second recess aligned with the second edge. The substrate is further isotropically etched to form a third recess in the substrate extending beneath the channel. The third recess is filled with an expanding material to exert an upward force on the channel and the first and second recesses are filled with a contact material. Conductivity determining ions are implanted into the contact material to form a source region and a drain region aligned with the first and second edges, respectively.

17 Claims, 3 Drawing Sheets

METHODS FOR FABRICATION OF A STRESSED MOS DEVICE

TECHNICAL FIELD OF THE INVENTION

The present invention generally relates to methods for the fabrication of stressed MOS devices, and more particularly to methods for fabricating stressed NMOS and CMOS devices.

BACKGROUND OF THE INVENTION

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain electrodes between which a current can flow. A control voltage applied to the gate electrode controls the flow of current through a channel between the source and drain electrodes.

MOS transistors, in contrast to bipolar transistor, are majority carrier devices. The gain of an MOS transistor, usually defined by the transconductance ($g_m$), is proportional to the mobility of the majority carrier in the transistor channel. The current carrying capability and hence the performance of an MOS transistor is proportional to the mobility of the majority carrier in the channel. The mobility of holes, the majority carrier in a P-channel MOS (PMOS) transistor can be increased by applying a compressive longitudinal stress to the channel. It is well known that a compressive longitudinal stress can be applied to a silicon MOS transistor by embedding a material such as silicon germanium (SiGe) at the ends of the transistor channel. The mobility of electrons, the majority carrier in an N-channel MOS (NMOS) transistor, however, is decreased by such a compressive longitudinal stress to the channel. To increase the mobility of electrons, a tensile stress must be applied to the channel of the MOS transistor.

Accordingly, it is desirable to provide a method of fabricating an NMOS transistor having enhanced majority carrier mobility. It is also desirable to provide a method for the fabrication of CMOS devices wherein both the NMOS and PMOS transistors have enhanced majority carrier mobility. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

In accordance with one embodiment of the invention a method comprises the steps of providing a monocrystalline semiconductor substrate having a surface and a channel abutting the surface. A gate electrode having a first edge and a second edge is formed overlying the monocrystalline semiconductor substrate. The substrate is anisotropically etched to form a first recess aligned with the first edge and a second recess aligned with the second edge. The substrate is further isotropically etched to form a third recess in the substrate extending beneath the channel. The third recess is filled with an expanding material to exert an upward force on the channel and the first and second recesses are filled with a contact material. Conductivity determining ions are implanted into the contact material to form a source region and a drain region aligned with the first and second edges, respectively.

BRIEF DESCRIPTION OF THE DRAWINGS

The present invention will hereinafter be described in conjunction with the following drawing figures, wherein like numerals denote like elements, and wherein FIGS. 1-9 schematically illustrate, in cross sectional views, a stressed MOS device and methods for its fabrication in accordance with various embodiments of the invention.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-9 illustrate a stressed MOS device 30 and method steps for manufacturing such an MOS device in accordance with various embodiments of the invention. In this illustrative embodiment stressed MOS device 30 is a CMOS device here illustrated by a single NMOS transistor 31 and a single PMOS transistor 33. As will become clear from the following description, the various embodiments of the invention are particularly directed to the enhancement of the mobility of electrons in the channel of an NMOS transistor. In accordance with one embodiment of the invention, however, an NMOS transistor having enhanced mobility is fabricated together with a PMOS transistor that also has enhanced mobility to achieve a CMOS device having superior characteristics. Those of skill in the art will recognize that the invention can be applied to either single channel NMOS devices or to CMOS devices. An integrated circuit formed from stressed MOS devices fabricated in accordance with the invention can include a large number of devices such as device 30, and may also include both stressed and unstressed P-channel MOS transistors and stressed and unstressed N-channel transistors.

Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
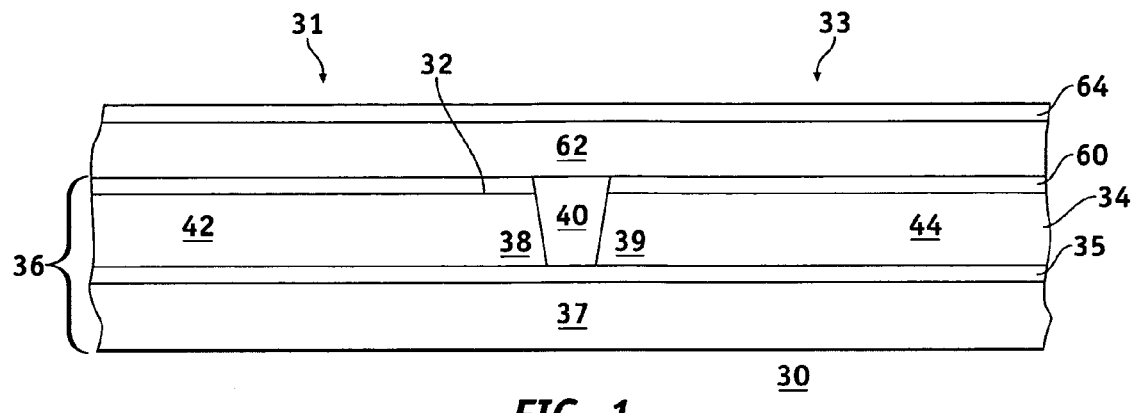

As illustrated in cross section in FIG. 1, the fabrication of stressed MOS device 30, in accordance with an embodiment of the invention, begins with providing a semiconductor substrate 36 having a surface 32. The semiconductor substrate can be any monocrystalline semiconductor material, but is preferably a monocrystalline silicon substrate wherein the term "silicon substrate" is used herein to encompass the relatively pure silicon materials typically used in the semiconductor industry. Semiconductor substrate 36 will herein be referred to, for ease of discussion but without limitation, as a silicon substrate. Those of skill in the art will recognize that semiconductor substrate 36 can also be formed of other semiconductor materials such as, for example, silicon germanium (SiGe) comprising between about 10 and about 30 atomic percent germanium in a silicon lattice. Silicon substrate 36 may be a bulk silicon wafer or a thin layer of silicon 34 on an insulating layer 35 (commonly know as silicon-on-insulator or SOI) that, in turn, is supported by a silicon carrier wafer 37, but preferably, as here illustrated, without limitation, is an SOI wafer. Whether formed of monocrystalline silicon or some other monocrystalline semiconductor material, the monocrystalline material forming substrate 36 and specifically thin layer 34 if the substrate is an SOI substrate, will be characterized by a lattice constant associated with the crystalline structure of that material. To fabricate a CMOS device, portions of thin silicon layer 34 will be doped with P-type impurity dopants (a P-well 38) for the fabrication of N-channel MOS transistors and other portions will be doped with N-type impurity dopants (an N-well 39) for the fabrication of P-channel MOS transistors. The P-well and N-well can be doped to the appropriate conductivity, for example, by ion implantation. Shallow trench isolation (STI) 40 or other form of electrical isolation is formed in the semiconductor substrate and preferably extends through thin layer of silicon 34 to insulating layer 35 to electrically isolate individual devices as required by the circuit function being implemented. As is well known, there are many processes that can be used to form the STI, so the process need not be described here in detail. In general, STI includes a shallow trench that is etched into the surface of the semiconductor substrate and that is subsequently filled with an insulating material. After the trench is filled with the insulating material the surface is usually planarized, for example by chemical mechanical planarization (CMP). The STI generally surrounds P-type active areas 42 in P-well 38 and N-type active areas 44 in N-well 39 of silicon substrate 36. Although not illustrated, there may be a plurality of N-type active areas and a plurality of P-type active areas, all electrically isolated from each other by the STI, as needed to implement the desired integrated circuit function.

With reference again to FIG. 1, a layer of gate insulator 60 is formed on the surface of thin silicon layer 34. The gate insulator may be a thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited by chemical vapor deposition (CVD), low pressure chemical vapor deposition (LPCVD), or plasma enhanced chemical vapor deposition (PECVD). As illustrated in FIG. 1, gate insulator 60 is a thermally grown silicon dioxide that grows only at the surface of the silicon layer. The gate insulator material is typically 1-10 nanometers (nm) in thickness. If the semiconductor substrate is a semiconductor material other than silicon, it may be advantageous to deposit the gate insulator. Alternatively, if the substrate is SiGe, it may be advantageous to epitaxially grow a thin stressed silicon layer (not illustrated) on the surface of the SiGe and to thermally oxidize the stressed silicon layer to form a silicon dioxide gate insulator. In accordance with one embodiment of the invention a layer of gate electrode forming material such as polycrystalline silicon 62 is deposited onto the layer of gate insulator. The layer of polycrystalline silicon is preferably deposited as undoped polycrystalline silicon and is subsequently impurity doped by ion implantation. The polycrystalline silicon material can be deposited, for example, to a thickness of about 100-120 nm by LPCVD by the hydrogen reduction of silane. A layer 64 of hard mask material such as silicon oxide, silicon nitride, or silicon oxynitride is deposited onto the surface of the polycrystalline silicon. The hard mask material can be deposited to a thickness of about 50 nm, also by LPCVD.

Figure 2:
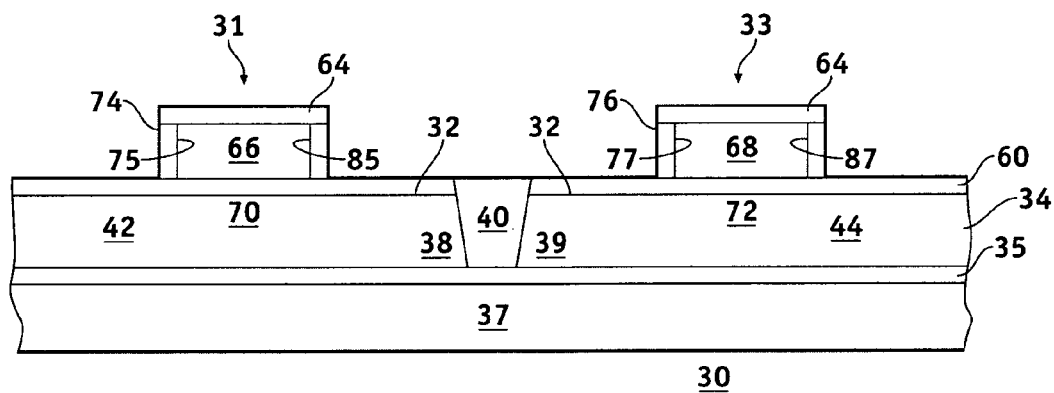

The layer of polycrystalline silicon 62 and the layer of hard mask material 64 are photolithographically patterned to form MOS transistor gate electrodes 66 and 68 as illustrated in cross section in FIG. 2. Gate electrode 66 overlies the portion of P-type active area 42 and P-well 38 of thin silicon layer 34 that will form channel 70 of NMOS transistor 31 at surface 32. In similar manner gate electrode 68 overlies the portion of N-type active area 44 and N-well 39 that will form the channel 72 of PMOS transistor 33, also at surface 32. The polycrystalline silicon can be etched in the desired pattern by, for example, plasma etching in a Cl or HBr/$O_2$ chemistry and the hard mask can be etched, for example, by plasma etching in a $CHF_3$, $CF_4$, or $SF_6$ chemistry. Following the patterning of the gate electrode, in accordance with one embodiment of the invention, a thin layer 74 of silicon oxide is thermally grown on the opposing sidewalls 75 and 85 of gate electrode 66 and a thin layer 76 of silicon oxide is thermally grown on the opposing sidewalls 77 and 87 of gate electrode 68 by heating the polycrystalline silicon in an oxidizing ambient. Layers 74 and 76 can be grown to a thickness of about 2-5 nm. Gate electrodes 66 and 68 and layers 74 and 76 can be used as an ion implantation mask to form source and drain extensions (not illustrated) on either or both of the MOS transistors. In addition, layers 74 and 76 protect the gate electrode profile. The possible need for and method of forming multiple source and drain regions are well known, but are not germane to this invention and hence need not be explained herein. As is well known, a layer of patterned photoresist can be used to mask the N-well region during implantation of the source and drain extensions of the PMOS transistor and another layer of patterned photoresist can be used to mask the P-well region during implantation of the source and drain extensions of the NMOS transistor.

Figure 3:
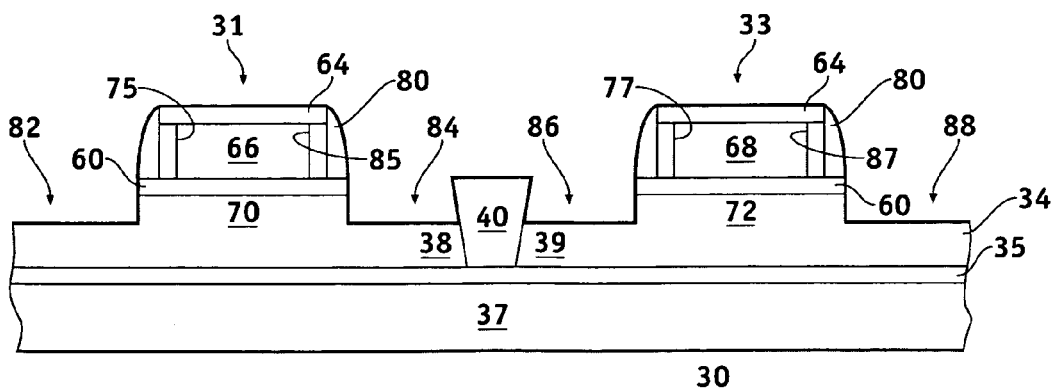

In accordance with one embodiment of the invention, as illustrated in FIG. 3, sidewall spacers 80 are formed on the thin oxide layer on the opposing sidewalls 75, 85 and 77, 87 of gate electrodes 66 and 68, respectively. The sidewall spacers can be formed of silicon nitride, silicon oxide, or the like by depositing a layer of the spacer material over the gate electrodes and subsequently anisotropically etching the layer, for example by reactive ion etching using a $CHF_3$, $CF_4$, or $SF_6$ chemistry. Sidewall spacers 80, gate electrodes 66 and 68, the hard mask on the top of the gate electrodes, and STI 40 are used as an etch mask to etch initial recesses 82 and 84 in the silicon substrate in spaced apart self alignment with the opposing edges of N-channel gate electrode 66 and to etch recesses 86 and 88 in spaced apart self alignment with the opposing edges of P-channel gate electrode 68. The recesses intersect the ends of the channels 70 and 72. The recesses can be anisotropically etched, for example by reactive ion etching using an HBr/$O_2$ and Cl chemistry. Preferably each of the recesses has a depth of about 0.04-0.1 μm.

Figure 4:
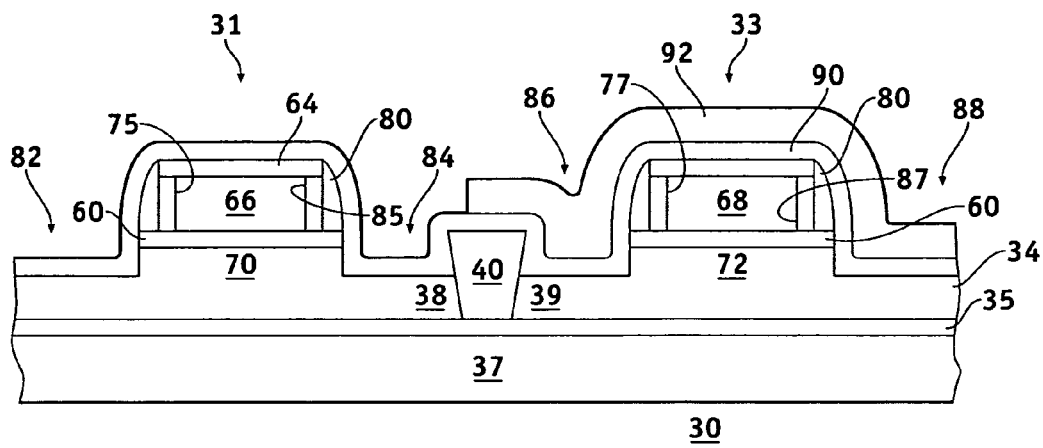

The method in accordance with an embodiment of the invention continues, as illustrated in FIG. 4, by depositing another layer of spacer forming material 90. A layer of photoresist 92 is applied over the layer of spacer forming material and is patterned to leave the layer of photoresist protecting PMOS transistor 33 and exposing NMOS transistor 31. As before, the spacer forming material can be silicon nitride, silicon oxide, or the like deposited by, for example, LPCVD.

Figure 5:
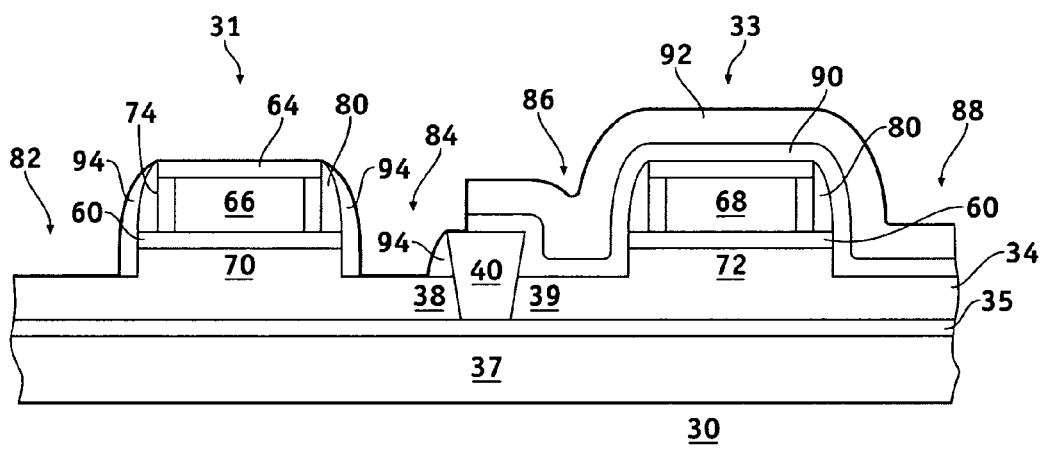

As illustrated in FIG. 5, the exposed portion of layer of spacer forming material 90 is anisotropically etched to form sidewall spacers 94 on the vertical edges of initial recesses 82 and 84. The anisotropic etching of the layer of spacer forming material exposes the bottoms of initial recesses 82 and 84 while protecting the edges of channel 70.

Figure 6:
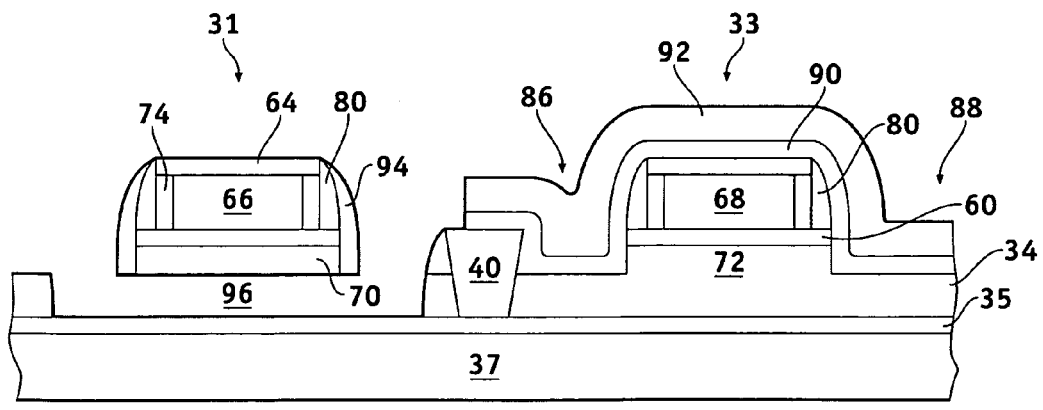

As illustrated in FIG. 6, the exposed bottoms of the initial recesses are isotropically etched, for example by plasma etching using an HBr/Cl chemistry together with $CF_4$, argon and oxygen to improve the isotropy. The isotropic etching increases the depth of the initial recesses and also etches sideways under channel 70. The etching preferably continues until a recess 96 extends completely under channel 70. If semiconductor substrate 36 is an SOI substrate, recess 96 preferably extends through the thickness of thin layer of silicon 34 to insulating layer 35. During the etching of recess 96 sidewall spacers 94 prevent the etching of the semiconductor material forming channel 70. Channel 70 thus remains as a bridge of semiconductor material overlying recess 96 and extending from the STI on one side of the active region to the STI on the other side of the active region.

Figure 7:
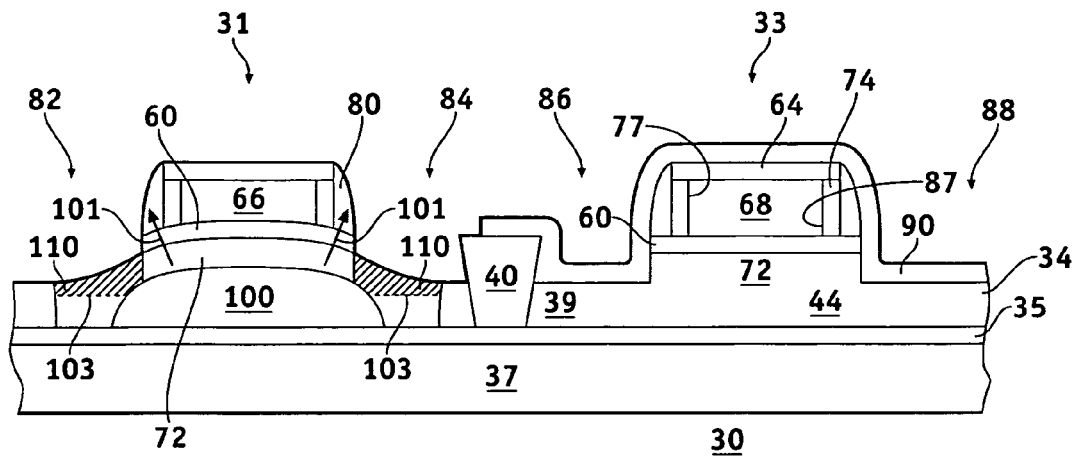

Following the etching of recess 96, the method in accordance with one embodiment of the invention continues by removing sidewall spacers 94 and photoresist layer 92. As is well known, photoresist layer 92 could have also been removed before the etching of recess 96. The remainder of layer 90 continues to mask PMOS transistor 33. Recess 96 is filled with an expanding material 100 such as silicon nitride, silicon carbide, or other insulators such as zeolite as illustrated in FIG. 7. In accordance with a preferred embodiment, expanding material 100 is thermally grown silicon dioxide. The expanding material fills recess 96 and exerts an upward force on channel 70 as illustrated by arrows 101. The upward force on channel 70 applies a uniaxial tensile stress to the channel, and such a tensile stress enhances the mobility of majority carrier electrons in the channel of NMOS transistor 31. Silicon dioxide can be grown to fill recess 96, for example, by heating the silicon of channel 70 in an oxidizing ambient. The lower portion of silicon forming channel 70 is oxidized, leaving a layer of silicon overlying the oxide. Silicon dioxide occupies a greater volume than the silicon consumed in the oxidation process. Alternatively, an expanding material such as silicon nitride or any other insulator material can be deposited, for example by LPCVD or PECVD, to fill recess 96. Such a deposited material would also partially fill recesses 82 and 84 as indicated by the dashed lines 103. In the case of a high temperature deposition, as the material cools following deposition, the material expands and applies the desired upward force on the channel. Alternatively, for those materials that are deposited at a low temperature, the desired upward force can be implemented by a heating cycle to cause the deposited material to at least partially form a lattice structure. Following the deposition of the expanding material, polycrystalline silicon, polycrystalline silicon germanium, or other conductive or semiconductive material 110 is deposited to fill initial recesses 82 and 84. During the processing of NMOS transistor 31, the remainder of spacer forming layer 90 protects PMOS transistor 33.

Figure 8:
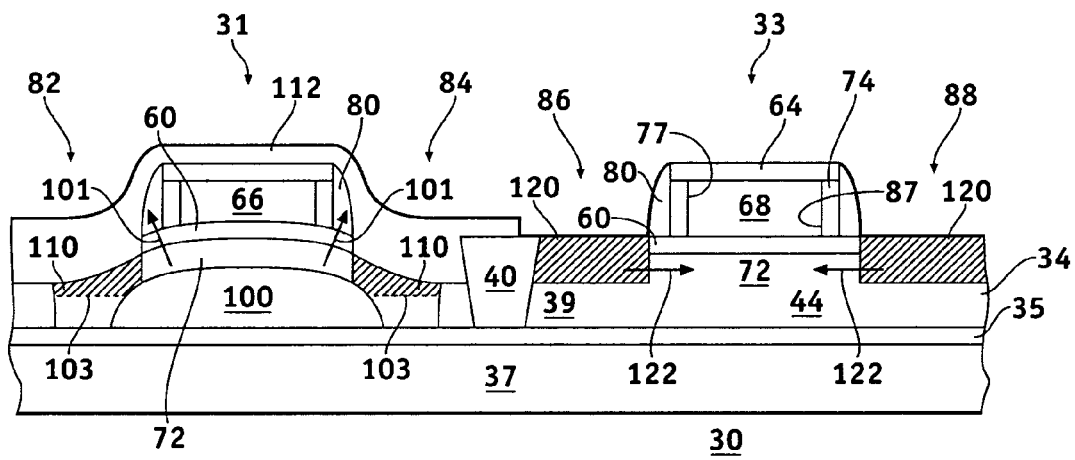

In accordance with one embodiment of the invention, after depositing material 110, the remainder of spacer forming layer 90 is removed and a masking layer of silicon oxide or other insulator 112 is deposited and photolithographically patterned to provide a protective masking layer overlying NMOS transistor 31 as illustrated in cross section in FIG. 8. A layer of stress inducing semiconductor material 120 having a lattice constant greater than the lattice constant of the host thin silicon layer 34 is selectively epitaxially grown to fill recesses 86 and 88 abutting channel 72 of PMOS transistor 33. For a host silicon material, the layer of stress inducing semiconductor material can be, for example, silicon germanium (SiGe) having about 10-30 atomic percent germanium. The SiGe has a greater lattice constant than silicon. In general, the layer of stress inducing semiconductor material can be any pseudomorphic material that can be epitaxially grown on the semiconductor substrate with a lattice constant greater than the lattice constant of the host semiconductor material. The epitaxial growth of layer 120 nucleates on the walls and bottom of recesses 86 and 88. Methods for epitaxially growing SiGe and other stress inducing materials on a silicon or other semiconductor host in a selective manner are will known and need not be described herein. The epitaxial growth is continued until recesses 86 and 88 are filled. During the selective growth of layer 120, masking layer 112 protects NMOS transistor 31, so no SiGe deposits on the NMOS transistor. Because SiGe has a greater lattice constant than silicon, layer 120 exerts a compressive longitudinal stress as indicated by arrows 122 on channel 72 of PMOS transistor 33. Such a compressive longitudinal stress increases the mobility of majority carrier holes in the channel of the PMOS transistor.

Figure 9:
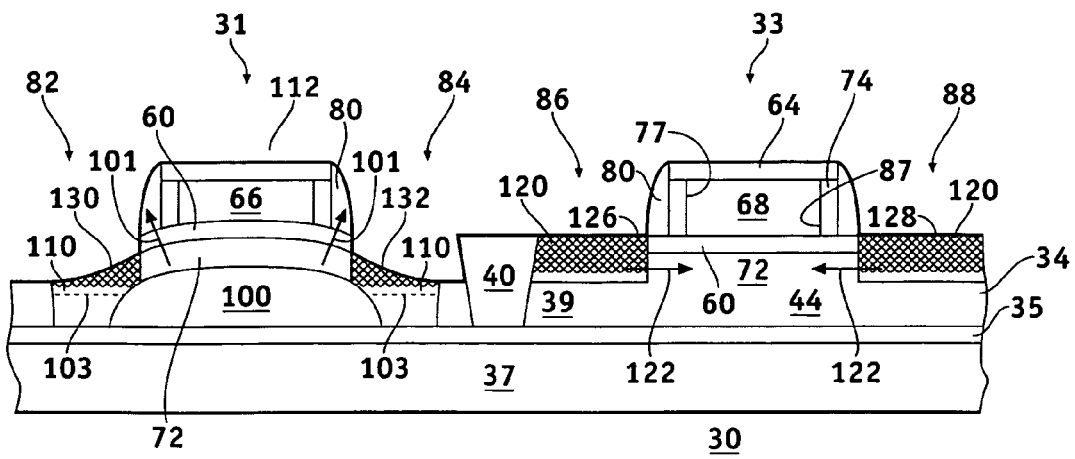

Source and drain regions of the MOS transistors can be partially or completely in-situ doped with conductivity determining impurities during the process of depositing material 110 and the selective epitaxial growth of layer 120. Otherwise, following the deposition of material 110 in recesses 82 and 84, the growth of the stress inducing material 120 in recesses 86 and 88, and the removal of masking layer 112, P-type conductivity determining ions are implanted into the stress inducing material in recesses 86 and 88 to form a source region 126 and a drain region 128 of PMOS transistor 33 as illustrated in FIG. 9. Similarly, N-type conductivity determining ions are implanted into material 110 in recesses 82 and 84 to form a source region 130 and a drain region 132 of NMOS transistor 31. Appropriate masking, for example with layers of patterned photoresist, can be used in the conventional manner to mask NMOS transistor 31 during the implanting of the P-channel source and drain regions and to mask PMOS transistor 33 during the implanting of the N-channel source and drain regions.

Stressed MOS device 30 can be completed by well known steps (not illustrated) such as depositing a layer of dielectric material, etching opening through the dielectric material to expose portions of the source and drain regions, and forming metallization that extends through the openings to electrically contact the source and drain regions. Further layers of interlayer dielectric material, additional layers of interconnect metallization, and the like may also be applied and patterned to achiever the proper circuit function of the integrated circuit being implemented.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a stressed MOS device comprising the steps of:

providing a silicon on insulator substrate comprising a thin layer of silicon on an insulator, the silicon on insulator substrate having a surface and a channel abutting the surface;

forming a gate electrode overlying the thin layer of silicon, the gate electrode having a first edge and a second edge;

anisotropically etching the thin layer of silicon to form a first recess aligned with the first edge and a second recess aligned with the second edge;

isotropically etching the thin silicon layer to form a third recess extending from the channel to the insulator;

filling the third recess with an expanding material to exert an upward force on the channel;

filling the first recess and the second recess with a contact material; and ion implanting conductivity determining ions into the contact material to form a source region and a drain region aligned with the first edge and the second edge, respectively.

2. The method of claim 1 wherein the step of providing a silicon on insulator substrate comprises the step of providing a silicon on insulator substrate comprising a thin layer of silicon on an insulator, wherein the thin layer of silicon comprises comprising a material selected from Si and SiGe.

3. The method of claim 1 wherein the step of anisotropically etching comprises the steps of:
anisotropically etching the thin layer of silicon to form a first recess and a second recess each of the first recess and the second recess having sidewalls and having a depth equal to an initial first depth; and
forming sidewall spacers on the sidewalls of the first recess and the second recess.

4. The method of claim 3 wherein the step of isotropically etching comprises the step of isotropically etching the thin layer of silicon below the sidewall spacers.

5. The method of claim 1 wherein the step of providing a silicon on insulator substrate comprises the step of providing a silicon on insulator substrate comprising a thin layer of silicon on an insulator, wherein the thin layer of silicon comprises monocrystalline silicon and wherein the step of filling the third recess comprises the step of thermally oxidizing the thin layer of monocrystalline silicon.

6. The method of claim 1 wherein the step of filling the third recess comprises the step of depositing a material selected from the group consisting of silicon oxide and silicon nitride.

7. The method of claim 1 wherein the step of filling the first recess and the second recess with a contact material comprises the step of depositing a layer of semiconductor material from the group consisting of silicon and silicon germanium.

8. A method for fabricating a stressed MOS device having a silicon on insulator substrate and a silicon channel at the surface of the silicon on insulator substrate, the silicon on insulator substrate comprising a thin layer of silicon on an insulator, the method comprising the steps of:
forming a gate electrode overlying the channel;
anisotropically etching a first recess into the thin layer of silicon aligned with the gate electrode;
further isotropically etching the thin layer of silicon to cause the first recess to extend under the channel to the insulator; and
filling the first recess with a material capable of exerting an upward force on the channel.

9. The method of claim 8 wherein the step of filling the recess comprises the step of thermally oxidizing the silicon substrate.

10. The method of claim 8 further comprising the step of depositing a layer of polycrystalline silicon to fill the first recess.

11. A method for fabricating a stressed MOS device comprising the steps of:
providing a silicon on insulator substrate comprising a thin layer of silicon on an insulator, the silicon on insulator substrate having a surface and a channel abutting the surface;
forming an N-type region and a P-type region in the silicon on insulator substrate, the P-type region including a channel;
forming a first gate electrode overlying the N-type region and a second gate electrode overlying the P-type region, the second gate electrode overlying the channel;
anisotropically etching first recesses in the silicon on insulator substrate in alignment with the first gate electrode and second recesses in the silicon on insulator substrate in alignment with the second gate electrode;
applying a masking layer protecting the first recesses;
isotropically etching the P-type region to enlarge the second recesses and to cause a portion of the second recesses to extend under the channel from the channel to the insulator;
thermally oxidizing the P-type region to fill the portion of the second recesses extending under the channel with a silicon oxide;
removing the masking layer; and
selectively growing a layer of a monocrystalline stress inducing semiconductor material in the first recess, the layer having a thickness sufficient to fill the first recesses.

12. The method of claim 11 wherein the step of selectively growing comprises the step of epitaxially growing a layer of SiGe.

13. The method of claim 11 further comprising the step of filling the second recesses with a semiconductor material selected from the group consisting of polycrystalline silicon and polycrystalline silicon germanium.

14. The method of claim 13 further comprising the steps of:
ion implanting P-type conductivity determining ions into the layer of a monocrystalline stress inducing semiconductor material in the first recesses; and
ion implanting N-type conductivity determining ions into the semiconductor material filling the second recesses.

15. The method of claim 11 wherein the step of anisotropically etching comprises the steps of:
anisotropically etching the P-type region to etch the second recesses to a first depth, the second recesses having side walls; and
forming sidewall spacers on the edges of the second recesses.

16. The method of claim 15 wherein the step of isotropically etching comprises the step of isotropically etching the P-type region using the sidewall spacers as an etch mask.

17. The method of claim 11 wherein the step of selectively growing comprises the step of epitaxially growing a layer of semiconductor material having a lattice constant greater than the lattice constant of monocrystalline silicon.

* * * * *